United States Patent
Pfizenmaier et al.

(10) Patent No.: US 11,190,003 B2
(45) Date of Patent: Nov. 30, 2021

(54) METHOD FOR CONTROLLING A CHARGING DEVICE OF A VEHICLE AND CHARGING DEVICE OF A VEHICLE FOR CHARGING AN ELECTRICAL ENERGY STORAGE DEVICE OF THE VEHICLE

(71) Applicant: Dr. Ing. h.c. F. Porsche Aktiengesellschaft, Stuttgart (DE)

(72) Inventors: Tim Pfizenmaier, Leonberg (DE); Daniel Spesser, Illingen (DE); Michael Kammer, Hungen (DE); Florian Habel, Gruenberg (DE); Eckhard Broeckmann, Gießen (DE); Frank Mehling, Ranstadt (DE); Michael Guenther Zeyen, Hayna (DE); Wolfgang Hofheinz, Gruenberg (DE); Guenter Uhl, Rohrbach (DE); Dietmar Bytzek, Germersheim (DE); Juergen Hetzler, Offenbach (DE); Stefan Zeltner, Erlangen (DE); Stefan Endres, Reichenschwand (DE); Christoph Sessler, Erlangen (DE)

(73) Assignees: Dr. Ing. h.c. F. Porsche Aktiengesellschaft; Bender GmbH & Co. KG; Fraunhofer-Gesellschaft zur Förderung der angewandten Forschung e.V.; vancom GmbH & Co. KG

( * ) Notice: Subject to any disclaimer, the term of this patent is extended or adjusted under 35 U.S.C. 154(b) by 408 days.

(21) Appl. No.: 16/291,381

(22) Filed: Mar. 4, 2019

(65) Prior Publication Data
US 2019/0270382 A1 Sep. 5, 2019

(30) Foreign Application Priority Data
Mar. 5, 2018 (DE) .......................... 102018104916.1

(51) Int. Cl.
*H02H 3/05* (2006.01)
*B60L 3/00* (2019.01)
(Continued)

(52) U.S. Cl.
CPC ............. *H02H 3/05* (2013.01); *B60L 3/0069* (2013.01); *B60L 53/16* (2019.02);
(Continued)

(58) Field of Classification Search
CPC ........ G01R 31/50; G01R 27/00; G01R 27/02; G01R 19/16547; B60L 3/0069;
(Continued)

(56) References Cited

U.S. PATENT DOCUMENTS

2011/0298466 A1* 12/2011 Hein .................. B60L 53/14
324/508
2015/0028818 A1* 1/2015 Merienne .................. H02J 7/02
320/137
2015/0198644 A1* 7/2015 Ripoll .................... B60L 53/16
320/109

FOREIGN PATENT DOCUMENTS

DE 102011101191 A1 11/2012

* cited by examiner

*Primary Examiner* — Paul Dinh
(74) *Attorney, Agent, or Firm* — RatnerPrestia

(57) ABSTRACT

A method for controlling a charging apparatus of a vehicle, in particular an electric or hybrid vehicle, wherein the charging apparatus has a charging device including a protection and monitoring device. The vehicle includes a high-voltage on-board power system and an electrical energy storage apparatus connected to the high-voltage on-board power system. The method includes electrically connecting the high-voltage on-board power system to charging connections of an energy supply system by the charging apparatus. The charging connections include a neutral conductor, a protective conductor and at least one phase conductor. A (Continued)

protective conductor resistance is detected between the neutral conductor and the protective conductor by feeding in a test current by the protection and monitoring device. A frequency of the test current is filtered out of the compensation frequency range on a narrowband basis.

9 Claims, 2 Drawing Sheets

(51) Int. Cl.
  *H02H 3/32* (2006.01)
  *B60L 53/16* (2019.01)
  *G01R 19/165* (2006.01)
  *H02J 7/00* (2006.01)
  *G01R 31/50* (2020.01)

(52) U.S. Cl.
  CPC ....... *G01R 19/16547* (2013.01); *G01R 31/50* (2020.01); *H02H 3/32* (2013.01); *H02J 7/007* (2013.01)

(58) Field of Classification Search
  CPC .......... B60L 53/11; B60L 53/14; B60L 53/16; H02H 3/05; H02H 3/32; H02H 3/33; H02H 3/40; H02J 7/00; H02J 7/007; Y02T 90/12; Y02T 90/14; Y02T 10/70; Y02T 10/7072
  USPC ........................................................ 320/109
  See application file for complete search history.

METHOD FOR CONTROLLING A CHARGING DEVICE OF A VEHICLE AND CHARGING DEVICE OF A VEHICLE FOR CHARGING AN ELECTRICAL ENERGY STORAGE DEVICE OF THE VEHICLE

CROSS-REFERENCE TO RELATED APPLICATION

This application claims priority to German Patent Application No. DE 10 2018 104 916.1, filed Mar. 5, 2018, which is incorporated by reference herein in its entirety.

FIELD OF THE INVENTION

The present invention relates to a method for controlling a charging apparatus of a vehicle and to a charging apparatus of a vehicle for charging an electrical energy storage device of the vehicle. In particular, the present invention relates to a method for controlling a charging apparatus of an electric or hybrid vehicle and to a charging apparatus for charging an electrical energy storage device of the electric or hybrid vehicle.

BACKGROUND OF THE INVENTION

In an electric vehicle or hybrid vehicle, provision is conventionally made for the energy storage device, which supplies electrical energy to the electric drive of the vehicle, to be able to be charged with energy from an energy supply system. Such an electrical energy storage device can be referred to as a storage battery, as a battery and, in particular, as a traction battery.

The energy supply system can comprise, for example, a so-called charging column, a wallbox, an in-cable control and protection device (or IC-CPD) and/or an electrical connection in or on a building. A charging apparatus is used to control the charging of the energy storage device and the charging process. Charging connections of the energy supply system, which supply the electrical energy, can be configured in a single-phase manner at, for example, 230 V or in a three-phase manner at 400 V Both the charging connections configured in a single-phase manner and also in a three-phase manner comprise a protective conductor. In order to ensure that the electric vehicle is protected with respect to ground with respect to a residual current (contact current) during the charging process, the charging connection usually comprises a residual current protection device (RCD). Said residual current protection device can be configured, for example, as a type A RCD circuit breaker Said residual current protection device measures the incoming currents and outgoing currents and is tripped in the case of a residual current with respect to ground in order to interrupt the power supply during charging.

DE 10 2011 101 191 A1, which is incorporated by reference herein, discloses a method for controlling a charging apparatus. The method comprises the detection of a first current, which is transmitted via at least one conductor, and the detection of a second current, which is transmitted via a neutral conductor. The charging apparatus is decoupled from an energy supply system when a current difference between the first current and the second current exceeds a predetermined current threshold value. In this case, the first and second currents are monitored continuously by means of hardware or software means.

Vehicles comprising a high-voltage on-board power system and an electrical energy storage device connected to the high-voltage on-board power system are also known. A low-voltage DC on-board power system, which is generally configured as an IT system, is usually referred to as a high-voltage on-board power system. The high-voltage on-board power system is electrically connected to the charging connections during the charging process. In this case, the high-voltage on-board power system can be galvanically connected to the charging connections or galvanically isolated from the charging connections. In the case of a galvanically non-isolated connection, the high-voltage on-board power system turns into a grounded TT system. This can result, inter alia, in Y capacitances connected in the charging apparatus and/or in the high-voltage on-board power system caused, inter alia, by interference suppression capacitors giving rise to stray currents on the protective conductor. These currents are driven by a grid frequency, a switching frequency of the charging apparatus and by loads connected to the high-voltage on-board power system, and by the harmonics thereof. These stray currents can trip residual current protection devices (RCDs) installed in the energy supply system, which leads to an undesired break in the charging process.

Furthermore, for the aforementioned vehicles, there would be the danger that differential DC currents that may be greater than 6 mA are fed into the charging connection in the event of a fault in the energy supply system. These currents could negatively influence the tripping characteristics of residual current protection devices (RCDs) installed in the energy supply system.

SUMMARY OF THE INVENTION

According to aspects of the invention, a method for controlling a charging apparatus of a vehicle, in particular an electric or hybrid vehicle, is proposed, wherein the charging apparatus has a charging device comprising a protection and monitoring device, wherein the vehicle comprises a high-voltage on-board power system and an electrical energy storage device connected to the high-voltage on-board power system, wherein the method comprises the following method steps:
  electrically connecting the high-voltage on-board power system to charging connections of an energy supply system by means of the charging apparatus, wherein the charging connections comprise a neutral conductor, a protective conductor and at least one phase conductor,
  detecting a protective conductor resistance between the neutral conductor and the protective conductor by feeding in a test current by means of the protection and monitoring device, wherein a frequency of the test current is either outside of a compensation frequency range of the protection and monitoring device or within the compensation frequency range of the protection and monitoring device and is filtered out of the compensation frequency range on a narrowband basis.

The method preferably comprises the following further method steps:
  detecting a stray current in the protective conductor,
  feeding in a compensation current, which is complementary to the stray current, in a predetermined frequency range, furthermore preferably by means of a capacitively coupled current compensation unit.

In one preferred configuration, the frequency range is between 5 Hz and 300 kHz, preferably between 25 Hz and 250 kHz.

The stray current in the protective conductor is preferably detected directly or indirectly by means of a first measurement current transducer.

In one preferred configuration, the infeed of the compensation current takes place in real time or quasi-real time.

This means that the compensation by feeding in the compensation current takes place within the same grid period.

The method preferably also comprises the further method steps of:
disconnecting the electrical connection between the high-voltage on-board power system 30 and charging connections, either by tripping a disconnection apparatus of the protection and monitoring device or by feeding in a trip current equaling a differential current in order to trip a protection device installed in the energy supply system.

The invention further relates to a charging apparatus of a vehicle, in particular an electric or hybrid vehicle, comprising a charging device, which comprises a protection and monitoring device, wherein the vehicle comprises a high-voltage on-board power system and an electrical energy storage device connected to the high-voltage on-board power system, wherein the charging apparatus is suitable for electrically connecting the high-voltage on-board power system to charging connections of an energy supply system, wherein the charging connections comprise a neutral conductor, a protective conductor and at least one phase conductor, wherein the charging apparatus can be controlled by the method according to aspects of the invention.

In one preferred configuration, the protection and monitoring device has a first measurement current transducer, which is suitable for detecting stray current in the protective conductor directly or indirectly.

The protection and monitoring device preferably has a loop resistance measurement device, which is suitable for detecting the protective conductor resistance between the neutral conductor and the protective conductor.

In one preferred configuration, the first measurement current transducer and the loop resistance measurement device are integrated into a measurement current unit.

DETAILED DESCRIPTION OF THE INVENTION

Figure 1A:
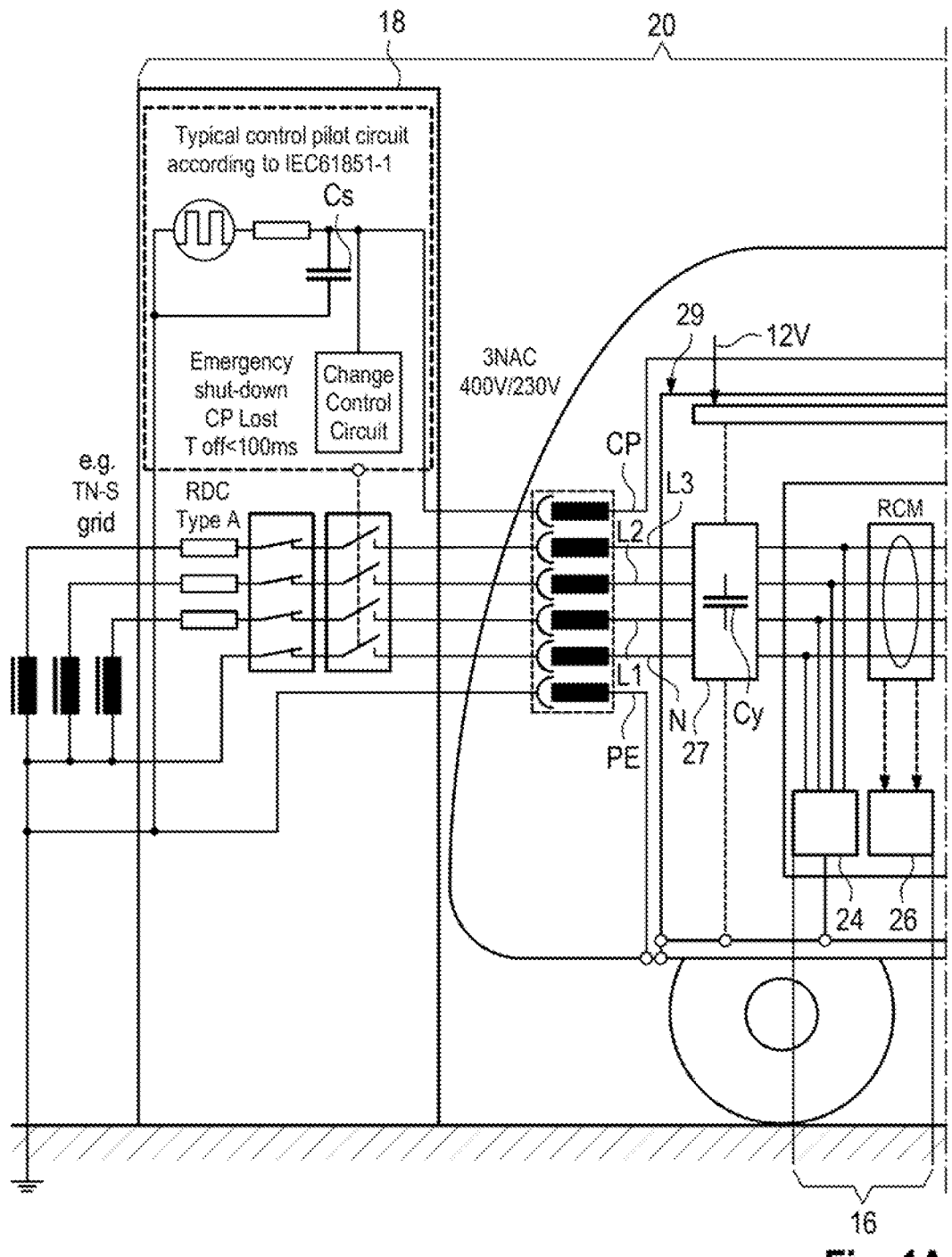
FIGS. 1A and 1B depict schematic illustrations of a charging apparatus in accordance with one exemplary embodiment and a motor vehicle.
Figure 1B:
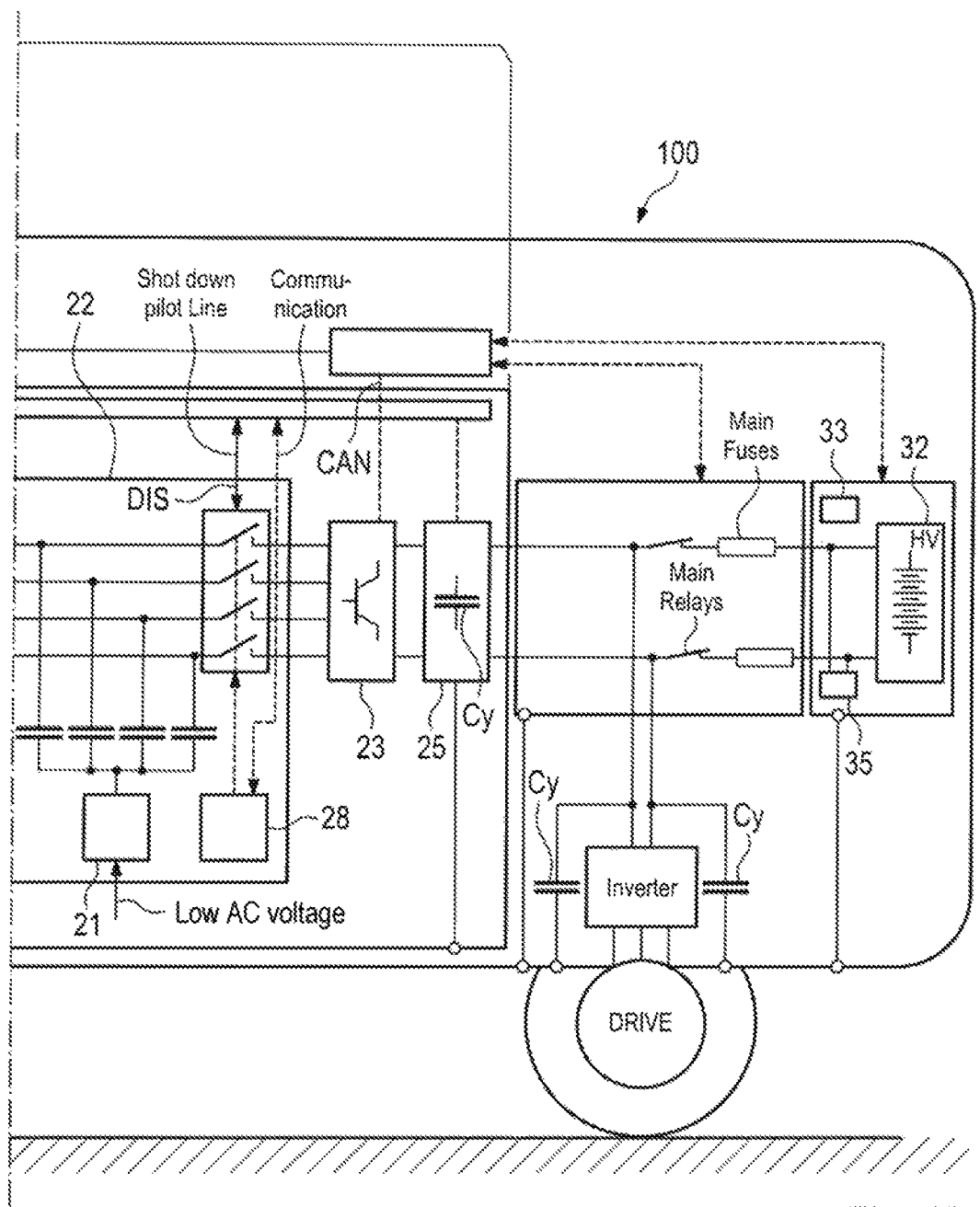

Details and further advantages of the method according to aspects of the invention and of the charging apparatus according to aspects of the invention are explained with reference to the exemplary embodiment described below.

Referring now to the figures, described herein is a charging apparatus 20 for a motor vehicle 100. The charging apparatus 20 comprises a charging connection 18 and a charging device 29 comprising a protection and monitoring device 22. The protection and monitoring device 22 can be arranged on the motor vehicle 100 side or on the charging connection 18 side.

The energy supply system can comprise, for example, a so-called charging column or an electrical connection in or on a building. The charging apparatus 20 is used to control the charging of the energy storage device 32 and the charging process.

The motor vehicle 100 comprises a high-voltage on-board power system 30 and an energy storage device 32 connected to the high-voltage on-board power system 30. The energy storage device 32 can be charged with energy by the charging apparatus 20 and feeds an electric drive of the motor vehicle. The energy storage device 32 can be referred to as a storage battery, as a battery and, in particular, as a traction battery. The energy storage device 32 can comprise a battery management system 33 and have an insulation monitoring device (IMD) 35. The charging apparatus 20 can be connected on the one hand to the high-voltage on-board power system 30 and on the other hand to the energy supply system.

To charge the electrical energy storage device 32, the high-voltage on-board power system 30 can be connected to charging connections 40 of an energy supply company. The charging connections can be configured in a single-phase manner at 230 V or in a three-phase manner at, for example, 400 V. Therefore, the charging connections 40 comprise a neutral conductor, a protective conductor PE and at least one phase conductor L1, L2, L3, The charging connections 40 comprise at least two conductors both in the single-phase configuration and in the three-phase configuration.

The high-voltage on-board power system 30 can be a high-voltage DC power system.

The charging device 29 comprises an input filter 27, an output filter 25 and a power electronics system 23 arranged between the input filter 27 and the output filter 25. The protection and monitoring device 22 is arranged between the transformer 23 and the input filter 27.

The protection and monitoring device 22 also comprises a first measurement current transducer 26, which is suitable for detecting a stray current arising in the protective conductor PE. The first measurement current transducer 26 can be provided with an integrated signal evaluation system. The protection and monitoring device 22 can also comprise a loop resistance measurement device 24, which serves to detect a residual current. In one preferred configuration, the first measurement current transducer 26 and the loop resistance measurement device 24 are integrated into a measurement current unit 16.

The protection and monitoring device 22 can also comprise a current compensation unit 21, which is suitable for feeding in a compensation current, which is complementary to the stray current, in a predetermined frequency range.

In one preferred configuration, the protection and monitoring device 22 comprises a disconnection apparatus 28. The electrical connection between the high-voltage on-board power system 30 and the charging connections 40 can be disconnected by means of the disconnection apparatus 28.

As an alternative or in addition, the current compensation unit 21 can be designed to feed in a trip current for tripping a protection device installed in the energy supply system. In this case, the trip current equals a differential current, which normally trips the protection device. As a result, additional protection can be achieved in the case of, for example, welded contacts of relays built into the high-voltage on-board power system 30. Furthermore, the vehicle 100 can be formed without the disconnection apparatus 28.

The charging apparatus 20 according to the application can be controlled by means of the method according to the application. The method comprises the following method steps:
electrically connecting the high-voltage on-board power system 30 to charging connections 40 of an energy supply system by means of the charging apparatus 20, wherein the charging connections 40 comprise a neutral conductor N, a protective conductor PE and at least one phase conductor L1, L2, L3, detecting a protective conductor resistance between the neutral conductor N and the protective conductor PE by feeding in a test current by means of the protection and monitoring device 22, wherein a frequency of the test current is either outside of a compensation frequency range of the protection and monitoring device 22 or within the compensation frequency range of the protection and monitoring device 22 and is filtered out of the compensation frequency range on a narrowband basis.

The method according to the application preferably comprises the following further method steps:

detecting a stray current, feeding in a compensation current, which is complementary to the stray current, in a predetermined frequency range, preferably by means of a capacitively coupled current compensation unit 2.

The predetermined frequency range is preferably between 5 Hz and 300 kHz, further preferably between 25 Hz and 250 kHz.

The stray current can be detected in the protective conductor PE by means of a first measurement current transducer 26.

The infeed of the compensation current can take place in real time or quasi-real time. That is to say that the compensation takes place within the same grid period.

The method can preferably comprise the following further method steps:

disconnecting the electrical connection between the high-voltage on-board power system 30 and charging connections 40, either by tripping a disconnection apparatus 28 of the protection and monitoring device 22 or by feeding in a trip current equaling a differential current in order to trip a residual current protection device (RCD) installed in the energy supply system.

The described protection and monitoring device 22 serves, in particular, to compensate for the stray currents arising from Y capacitances within the charging device 29, said Y capacitances being installed in the high-voltage on-board power system.

The compensation unit 21 is designed to achieve uniform compensation in a given frequency range and not exclusively in the frequencies of specific grid harmonics, as in the case of the compensation units known from the prior art.

Stray currents arising in the high-voltage on-board power system 30, for example due to high-voltage components, such as, for example, an air-conditioning compressor, can be compensated for by means of the protection and monitoring device 22.

What is claimed is:

1. A method for controlling a charging apparatus of an electric or hybrid vehicle, wherein the charging apparatus has a charging device comprising a protection and monitoring device, wherein the vehicle comprises a high-voltage on-board power system and an electrical energy storage device connected to the high-voltage on-board power system, wherein the method comprises:

electrically connecting the high-voltage on-board power system to charging connections of an energy supply system by way of the charging apparatus, wherein the charging connections comprise a neutral conductor, a protective conductor and at least one phase conductor, detecting a protective conductor resistance between the neutral conductor and the protective conductor by feeding in a test current by way of the protection and monitoring device, filtering out a frequency of the test current, which is either outside of a compensation frequency range of the protection and monitoring device or within the compensation frequency range of the protection and monitoring device, from the compensation frequency range on a narrowband basis, detecting a stray current, and feeding in a compensation current, which is complementary to the stray current, in a predetermined frequency range, by way of a capacitively coupled current compensation unit.

2. The method as claimed claim 1, wherein the frequency range is between 5 Hz and 300 kHz.

3. The method as claimed in claim 1, wherein the frequency range is between 25 Hz and 250 kHz.

4. The method as claimed in claim 1, wherein the stray current is detected in the protective conductor directly or indirectly by way of a first measurement current transducer.

5. The method as claimed in claim 1, wherein the infeed of the compensation current takes place in either real time or quasi-real time.

6. The method as claimed in claim 1, further comprising disconnecting the electrical connection between the high-voltage on-board power system and the charging connections either by tripping a disconnection apparatus of the protection and monitoring device or by feeding in a trip current equaling a differential current in order to trip a protection device installed in the energy supply system.

7. A charging apparatus for an electric or hybrid vehicle, the charging apparatus comprising:

a charging device including a protection and monitoring device, a high-voltage on-board power system and an electrical energy storage device connected to the high-voltage on-board power system, wherein the charging apparatus is configured for electrically connecting the high-voltage on-board power system to charging connections of an energy supply system, and wherein the charging connections comprise a neutral conductor, a protective conductor and at least one phase conductor, wherein the protection and monitoring device includes a first measurement current transducer configured for detecting stray current in the protective conductor either directly or indirectly.

8. The charging apparatus as claimed in claim 7, wherein the protection and monitoring device includes a loop resistance measurement device, which is configured for detecting a protective conductor resistance between the neutral conductor and the protective conductor.

9. The charging apparatus as claimed in claim 8, wherein the first measurement current transducer and the loop resistance measurement device are integrated into a measurement current unit.

* * * * *